US006982186B2

(12) United States Patent
Jeon et al.

(10) Patent No.: US 6,982,186 B2
(45) Date of Patent: Jan. 3, 2006

(54) CMOS IMAGE SENSOR AND METHOD FOR MANUFACTURING THE SAME

(75) Inventors: In Gyun Jeon, Icheon-Si (KR); Kwang Soo Kim, Icheon-Si (KR); Jin Su Han, Icheon-Si (KR)

(73) Assignee: DongbuAnam Semiconductor Inc., Seoul (KR)

( * ) Notice: Subject to any disclaimer, the term of this patent is extended or adjusted under 35 U.S.C. 154(b) by 31 days.

(21) Appl. No.: 10/747,302

(22) Filed: Dec. 30, 2003

(65) Prior Publication Data

US 2005/0067639 A1  Mar. 31, 2005

(30) Foreign Application Priority Data

Sep. 25, 2003  (KR)  ............... 10-2003-0066566

(51) Int. Cl.
*H01L 21/00* (2006.01)
(52) U.S. Cl. .......................... 438/73; 438/237
(58) Field of Classification Search ............ 438/57–99, 438/218–238, 510–532

See application file for complete search history.

(56) References Cited

U.S. PATENT DOCUMENTS

| 6,462,365 | B1 | 10/2002 | He et al. | |
| 6,486,521 | B2 * | 11/2002 | Zhao et al. | 257/443 |
| 2003/0086011 | A1 * | 5/2003 | Wu et al. | 348/308 |
| 2003/0127666 | A1 * | 7/2003 | Lee | 257/225 |
| 2004/0251468 | A1 * | 12/2004 | Mouli et al. | 257/80 |
| 2005/0023553 | A1 * | 2/2005 | Rhodes | 257/162 |
| 2005/0064665 | A1 * | 3/2005 | Han | 438/286 |

FOREIGN PATENT DOCUMENTS

| KR | 2001-0061349 | 7/2001 |
| KR | 2003-0052639 | 6/2003 |
| LR | 2001-0061353 | 7/2001 |

* cited by examiner

*Primary Examiner*—Savitri Mulpuri
(74) *Attorney, Agent, or Firm*—Finnegan, Henderson, Farabow, Garrett & Dunner, L.L.P.

(57) ABSTRACT

A CMOS image sensor and a method for manufacturing the same, capable of preventing an interface between an active region and a field region in the CMOS image sensor from being damaged by ion implantation. The method comprises implanting dopant ions into a source region between a gate electrode of the reset transistor and the photodiode, using an ion implantation mask that covers predetermined locations of the field region and the source region.

14 Claims, 13 Drawing Sheets

CMOS IMAGE SENSOR AND METHOD FOR MANUFACTURING THE SAME

This application is based on and claims the priority to Korean Patent Application No. 10-2003-0066566, filed Sep. 25, 2003, the entire contents of which are incorporated herein by reference.

BACKGROUND OF THE INVENTION

1. Field of the Invention

The present invention relates to a CMOS image sensor and method for manufacturing the same, and more particularly to a CMOS image sensor and a method for manufacturing the same, in which the interface between active regions and field regions of the CMOS image sensor are not damaged by ion implantation.

2. Description of the Prior Art

In general, an image sensor is a semiconductor device for converting an optical image into electrical signals, and is generally divided into a CCD (Charge Coupled Device) and a CMOS (Complementary Metal Oxide Semiconductor) image sensor.

A CCD is a device in which charge carriers are stored and transferred to MOS capacitors and each MOS capacitor is disposed close to each other, while a CMOS image sensor is a device employing a switching mode of forming MOS transistors as many as the number of pixels using CMOS technology, and makes use of controlling and signal processing circuits as a peripheral circuit to detect light outputs using the MOS transistors.

A CCD has various disadvantages, such as complicated drive mode, high power consumption, difficulty of realization of a signal processing circuit in a chip for the CCD due to undesirably large number of mask processes, and so on. In order to overcome these disadvantages, studies have been conducted in the development of CMOS image sensors using sub-micron CMOS manufacturing technology.

A CMOS image sensor senses an image using a photodiode and a MOS transistor in each pixel for detecting light signals in a switching mode. As mentioned above, because the CMOS image sensor makes use of CMOS manufacturing technologies, the CMOS image sensor has a low power consumption as well as a simple manufacturing process, which requires only about 20 masks, compared to 30 to 40 masks in the CCD manufacturing process. As a result, the CMOS image sensor can have a signal processing circuit integrated into a single chip, resulting in a compact product, which is suitable for various applications.

Figure 1:
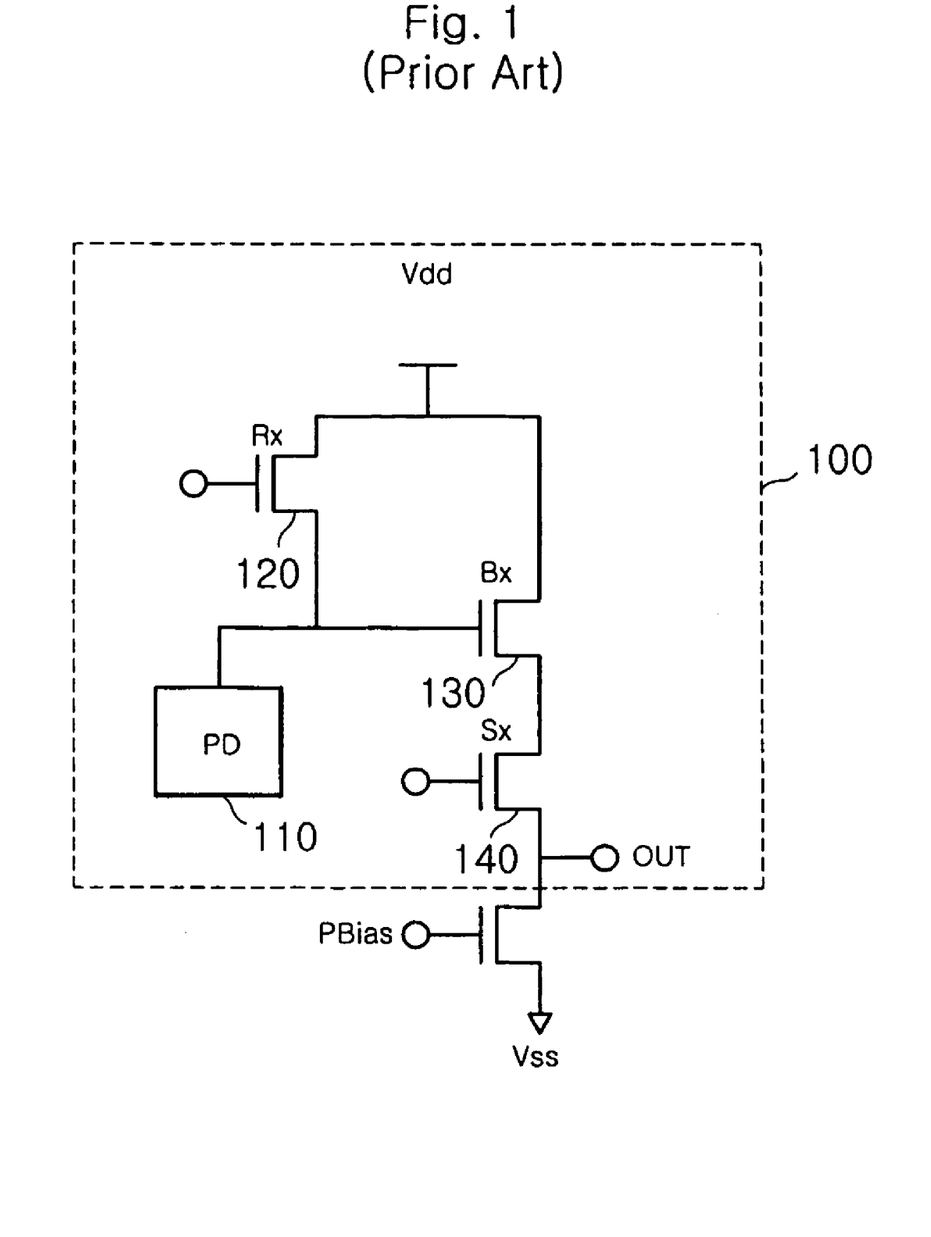
FIG. 1 is a circuit diagram showing a structure of a unit pixel of a conventional CMOS image sensor.
Figure 2:
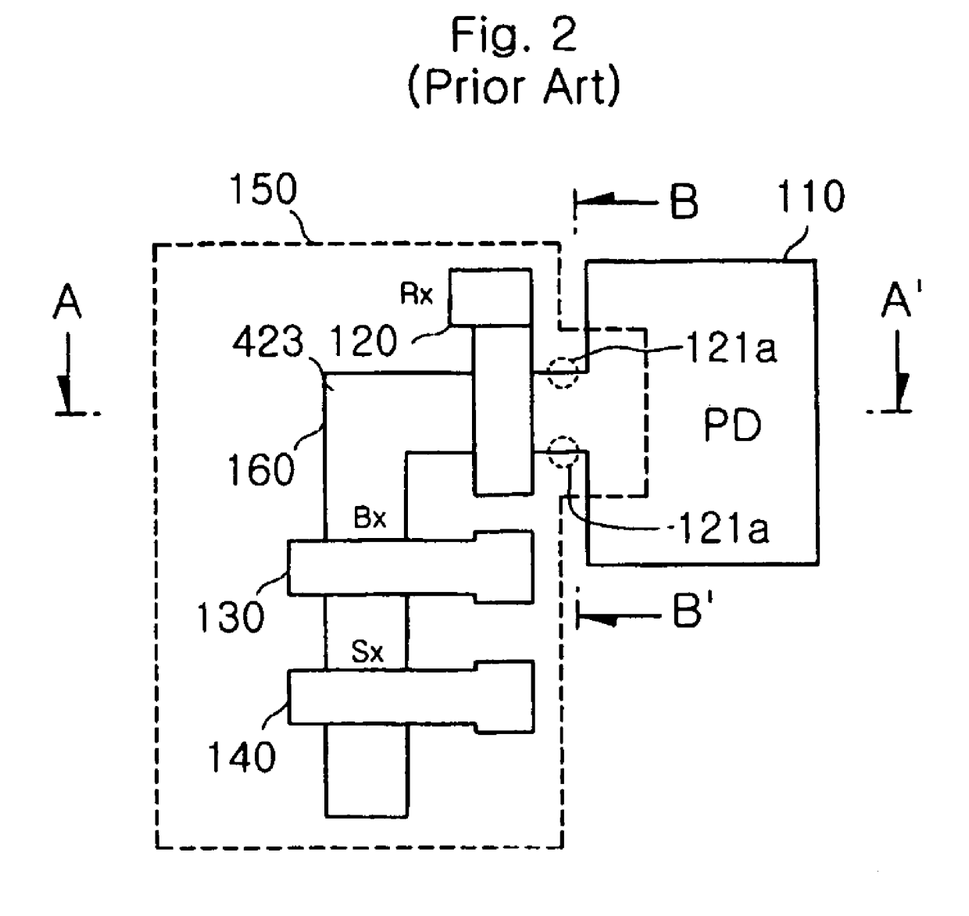
FIG. 2 is a layout diagram showing a unit pixel of the conventional CMOS image sensor.

Hereinafter, a description will be made regarding a construction of the CMOS image sensor. FIGS. 1 and 2 are a circuit diagram and a layout diagram, respectively, showing a structure of a unit pixel of a conventional CMOS image sensor. Although the number of transistors in a CMOS image sensor may be three or more, for illustration purposes, only a CMOS image sensor with three transistors will be described.

As shown in FIGS. 1 and 2, a unit pixel 100 of the CMOS image sensor comprises a photodiode 110 as a means for sensing light and three NMOS (N-channel Metal Oxide Semiconductor) transistors. Among the three transistors, one is a reset transistor (Rx) 120, which functions not only to transfer optical charges generated from the photodiode 110 but also to discharge charges so as to detect signals, another is a buffer transistor (Bx) 130, which functions as a source follower, and the other is a select transistor (Sx) 140, which performs switching and addressing functions.

Meanwhile, in the unit pixel 100 of the CMOS image sensor, the photodiode 110 is designed to function as a source of the reset transistor (Rx) 120 in order to facilitate transfer of the charges. To this end, in the course of manufacturing the unit pixel 100 of the image sensor, a process of implanting low- or high-concentration dopant ions into a portion of a semiconductor substrate including a part of the photodiode 110 is used, as shown in FIG. 2. The manufacturing process will be described with reference to a cross-section taken along line A–A' of FIG. 2. In FIG. 2, a dotted line indicates a region 150 into which high-concentration or low-concentration dopant ions are implanted, while a solid line indicates an active region 160.

Figure 3A:
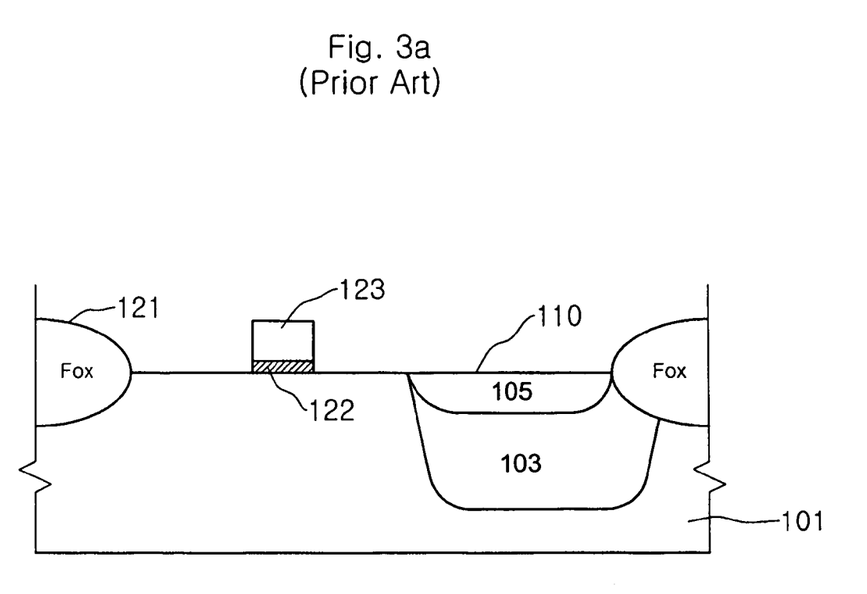
FIGS. 3a to 3c are cross-sectional views taken along line A–A' of FIG. 2 for illustration of a manufacturing process.

First, as shown in FIG. 3a, a gate insulating layer 122 and a gate electrode 123 are sequentially formed on a p-type semiconductor substrate 101, on which an element isolating layer, or a field region, 121 is completely formed. A low-concentration n-type dopant region 103 of the photodiode 110 is formed in an active region defined by the element isolating layer 121. Then, a p-type dopant region 105 is formed in the low-concentration n-type dopant region 103. Thereby, the photodiode 110 is finished.

Figure 3B:
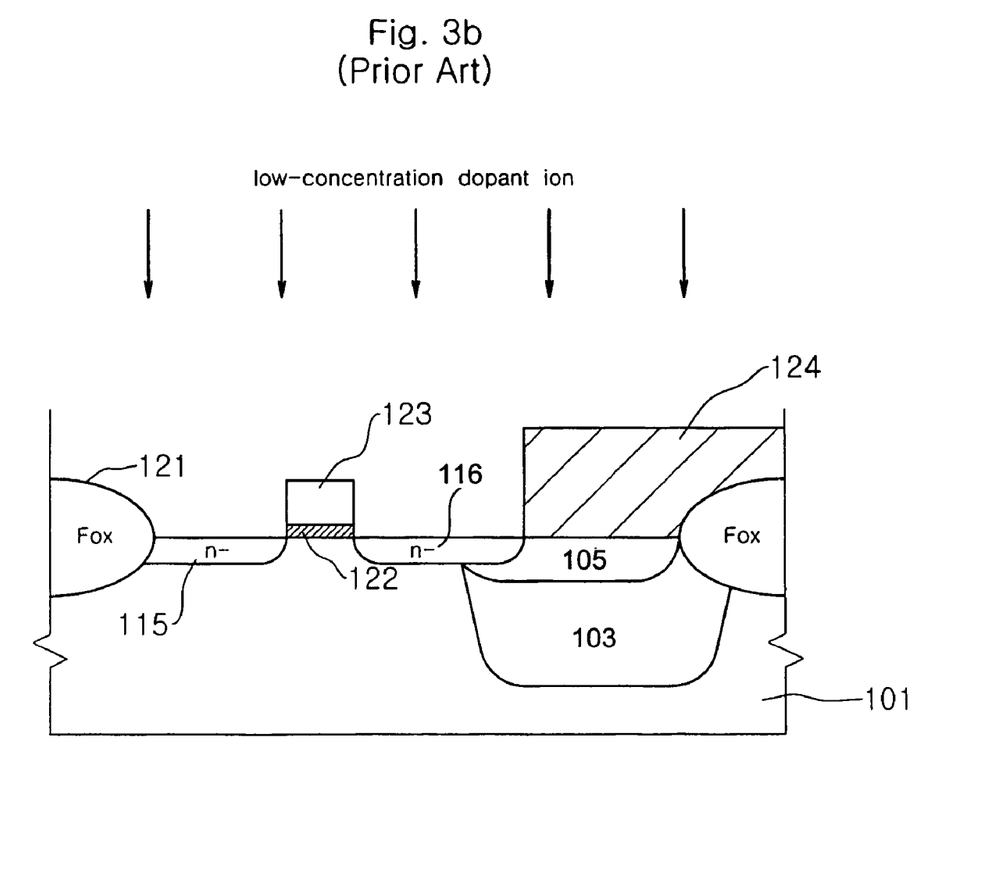

As shown in FIG. 3b, a photoresist layer 124 is applied on the substrate 101, and is then selectively patterned to expose the substrate 101 including a part of the photodiode 110. Subsequently, using the patterned photoresist layer 124, the gate insulating layer 122, and the gate electrode 123 as a mask, low-concentration n-type dopant ions are implanted into the substrate 101, thereby forming lightly doped drain (LDD) structures 115 and 116. The low-concentration n-type dopant ions implanted into the part of the photodiode 110 allows the photodiode to function as a source of the reset transistor Rx as mentioned above.

Figure 3C:
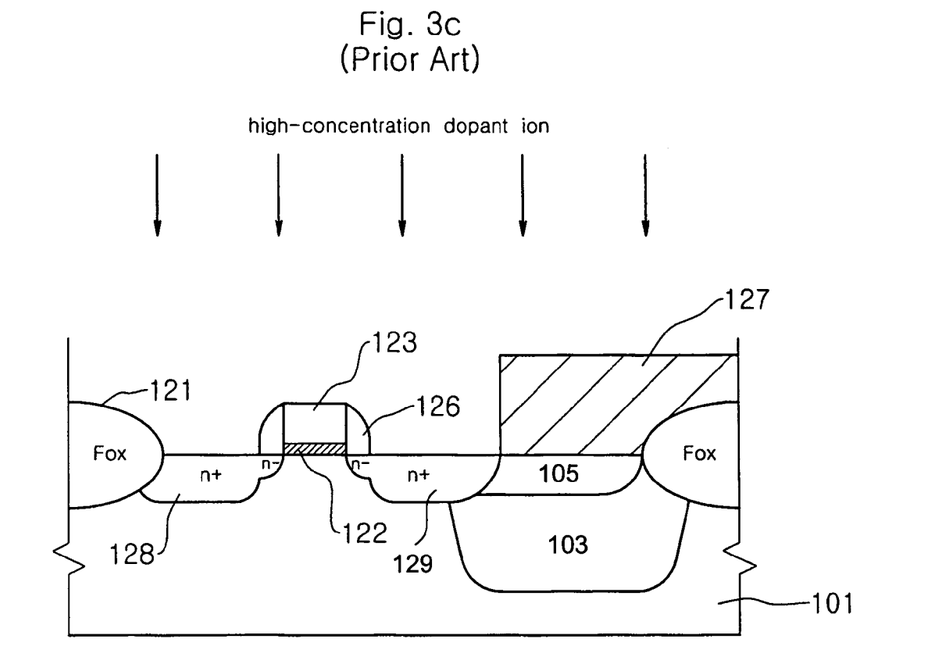

Further, as shown in FIG. 3c, a spacer 126 is formed on the side walls of the gate electrode 123. A photoresist pattern 127 is formed on the substrate 101, wherein the photoresist pattern 127 has the same pattern as the patterned photoresist layer 124 of FIG. 3b. Then, using the photoresist pattern 127, the gate insulating layer 122, the gate electrode 123, and the spacer 126 as a mask, high-concentration n-type dopant ions are implanted into the substrate 101 to form a source region 128 and a drain region 129.

Figure 3D:
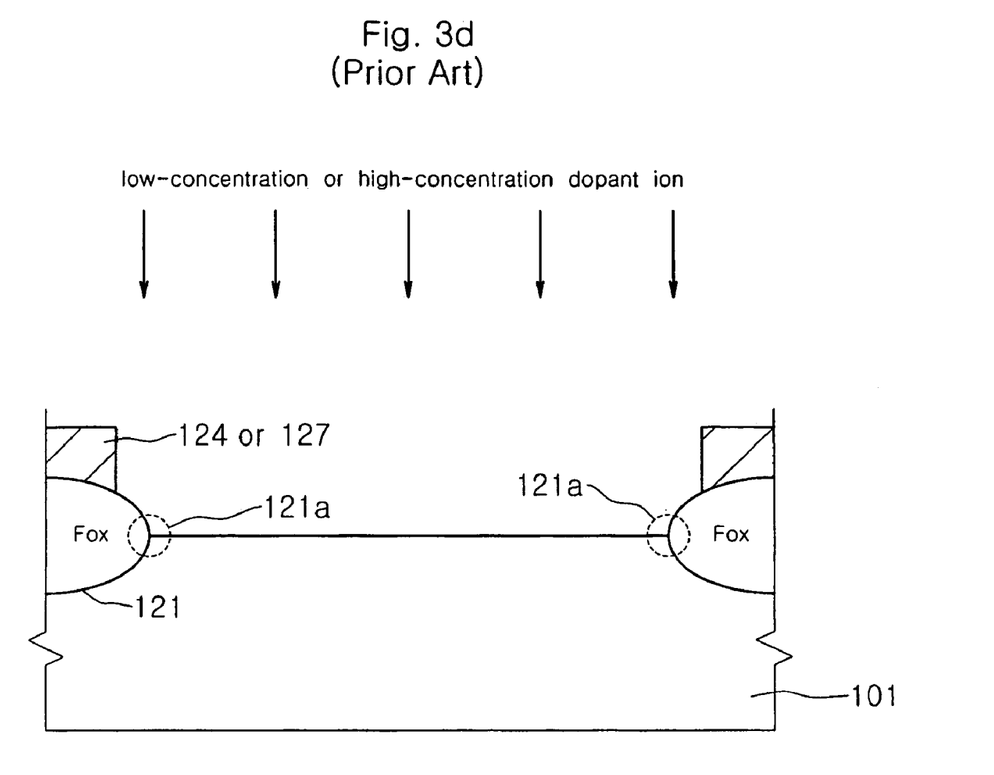
FIG. 3d is a cross-sectional view taken along line B–B' of FIG. 2.

FIG. 3d shows a cross-sectional view taken along line B–B' of FIG. 2. As shown in FIG. 3d, when implanting the low-concentration n-type dopant ions for the LDD structures 115 and 116 and the high-concentration n-type dopant ions for forming the source/drain regions 128 and 129, the respective photoresist patterns 124 and 127 used as an ion implantation mask are designed to expose a part of the element isolating layer 121.

According to the conventional method for manufacturing the CMOS image sensor, to improve charge movement characteristics, dopant ions for the LDD structures 115 and 116 and the source/drain regions 128 and 129 are implanted into a part of the photodiode 110 so as to allow the photodiode 110 to function as a source of the reset transistor Rx of the CMOS image sensor. However, as shown in FIG. 3d, the dopant ions are implanted into the active region as well as part of the element isolating layer 121 or the field region, and defects caused by ion implantation are generated at the interface between the active region and the field region.

These defects caused by ion implantation generate electrons or holes and provide recombination centers for the electrons and holes, thus increasing a leakage current of the photodiode. In other words, a dark current, i.e., a current due to the movement of electrons to a floating diffusion region in the photodiode while no light is present, is increased. The dark current is mainly a result of various defects distributed around the silicon surface, at the interface between the element isolating layer 121 and the p-type dopant region 105, as indicated by reference numerals 121a in FIG. 3d, at the interface between the element isolating layer 121 and the low-concentration dopant region 103, at the interface between the p-type dopant region 105 and the low-concentration dopant region 103, in the p-type dopant region 105, or in the low-concentration dopant region 103, or from a dangling bond. The dark current deteriorates low illumination characteristics of the CMOS image sensor.

Pending Korean Patent Publication Nos. 2001-61349, 2001-61353, and 2003-52639 disclose a method for reducing dark current of CMOS image sensor, which, however, does not present a solution to restrict an increase of dark current by preventing impurities from being ion-implanted into the boundary portion between an isolation layer and an active region for a photodiode.

Also, U.S. Pat. No. 6,462,365, entitled "active pixel having reduced dark current in a CMOS image sensor", discloses a method for restricting an increase of dark current due to a dangling bond at the surface of a photodiode, in which an isolation layer and a transfer gate as a passivation layer are formed on the surface of the photodiode. However, the method does not present a solution to restrict an increase of dark current by preventing impurities from being ion-implanted into the boundary portion between the isolation layer and the active region for the photodiode.

SUMMARY OF THE INVENTION

According to the present invention, there is provided a method for solving the above-mentioned problems occurring in the prior art, and a feature of the present invention is to provide a complementary metal oxide semiconductor (CMOS) image sensor and a method for manufacturing the same, in which an interface between an active region and a field region in the CMOS image sensor is prevented from being damaged by ion implantation.

According to one aspect of the present invention, there is provided a method for manufacturing a complementary metal oxide semiconductor (CMOS) image sensor, in which the CMOS image sensor includes a photodiode and a reset transistor, the method comprising a step of implanting dopant ions into a source region between a gate electrode of the reset transistor and the photodiode, using an ion implantation mask that covers predetermined locations of the field region and the source region.

In one aspect, the dopant ions are one of low-concentration dopant ions for an LDD structure and high-concentration dopant ions for a source/drain region.

In another aspect, the dopant ions are implanted into a part of the photodiode.

In one aspect, the low-concentration dopant ions for the LDD structure are implanted into a predetermined location of the field region around the source region, and the high-concentration dopant ions for the source/drain region are implanted not beyond the source region.

In another aspect, the low-concentration dopant ions for the LDD structure are implanted into a predetermined location of the field region around the source region, and the high-concentration dopant ions for the source/drain region are implanted only into a side of a gate electrode opposite to the source region.

According to another aspect of the present invention, there is provided a method for manufacturing a complementary metal oxide semiconductor (CMOS) image sensor, in which the CMOS image sensor includes a photodiode and a reset transistor, the method comprising a step of defining an active region by means of a field region in such a manner that a source region between a gate electrode of the reset transistor and the photodiode has a width widened from the gate electrode toward the photodiode.

In one aspect, the method further comprises a step of forming a channel stop region having a predetermined thickness beneath the field region and in a predetermined location of the active region adjoining the field region.

In another aspect, the channel stop region is formed by implanting boron ions, as p-type dopant ions, at an energy between 80 and 150 KeV and a concentration between $0.5 \times 10^{13} \sim 5 \times 10^{13}$ ion/cm$^2$.

According to the present invention, there is also provided a complementary metal oxide semiconductor (CMOS) image sensor having a photodiode and a reset transistor, characterized in that within an active region defined by a field region, a source region between a gate electrode of the reset transistor and the photodiode has a width widened from the gate electrode toward the photodiode.

According to the present invention, when dopant ions for the LDD structure or the source/drain region are implanted, it is possible to prevent the substrate from being damaged at the interface between the active region and the field region by ion implantation. Thus, a dark current of the CMOS image sensor can be minimized.

Also according to the present invention, there is provided a method for manufacturing a complementary metal oxide semiconductor (CMOS) image sensor, comprising steps of: forming a field region defining an active region on a silicon substrate; forming a gate electrode on the substrate; forming a photodiode in a portion of the active region; forming a masking layer so as to define a region for implanting dopant ions; and performing an ion implantation of impurities into the region for implanting dopant ions for forming an LDD structure, a source region, or a drain region, and wherein, in the step of forming the masking layer, the masking layer is formed over the field region and a portion of the active region adjoining the field region between the gate electrode and the photodiode so as to define the region for implanting dopant ions.

Still according to the present invention, there is provided a method for manufacturing a complementary metal oxide semiconductor (CMOS) image sensor, comprising steps of: forming a field region defining an active region on a silicon substrate; forming a gate electrode on the substrate; forming a photodiode in a portion of the active region; forming a masking layer over the field region, and performing a low-concentration dopant ion implantation for an LDD structure; forming a masking layer over the field region and a portion of the active region adjoining the field region between the gate electrode and the photodiode so as to define the region for implanting a high-concentration dopant ions; and performing an high-concentration dopant ion implantation into the region for implanting a high concentration dopant ions for forming a source region or a drain region.

According to aspect of the present invention, there is still provided a method for manufacturing a complementary metal oxide semiconductor (CMOS) image sensor, comprising steps of: forming a field region defining an active region on a silicon substrate; forming a gate electrode on the substrate; forming a photodiode in a portion of the active region; forming a masking layer over the field region, and performing a low-concentration dopant ion implantation for an LDD structure; forming a masking layer over the field region, the photodiode, and a region between the gate electrode and the photodiode so as to define the region for implanting a high-concentration dopant ions; and performing an high-concentration dopant ion implantation into the region for implanting a high concentration dopant ions for forming a source region or a drain region.

BRIEF DESCRIPTION OF THE DRAWINGS

The above and other features and advantages of the present invention will be more apparent from the following detailed description taken in conjunction with the accompanying drawings, in which.

DETAILED DESCRIPTION OF THE EMBODIMENTS

Hereinafter, a CMOS image sensor according to the present invention and a method for manufacturing the same will be described with reference to the accompanying drawings.

Figure 4:
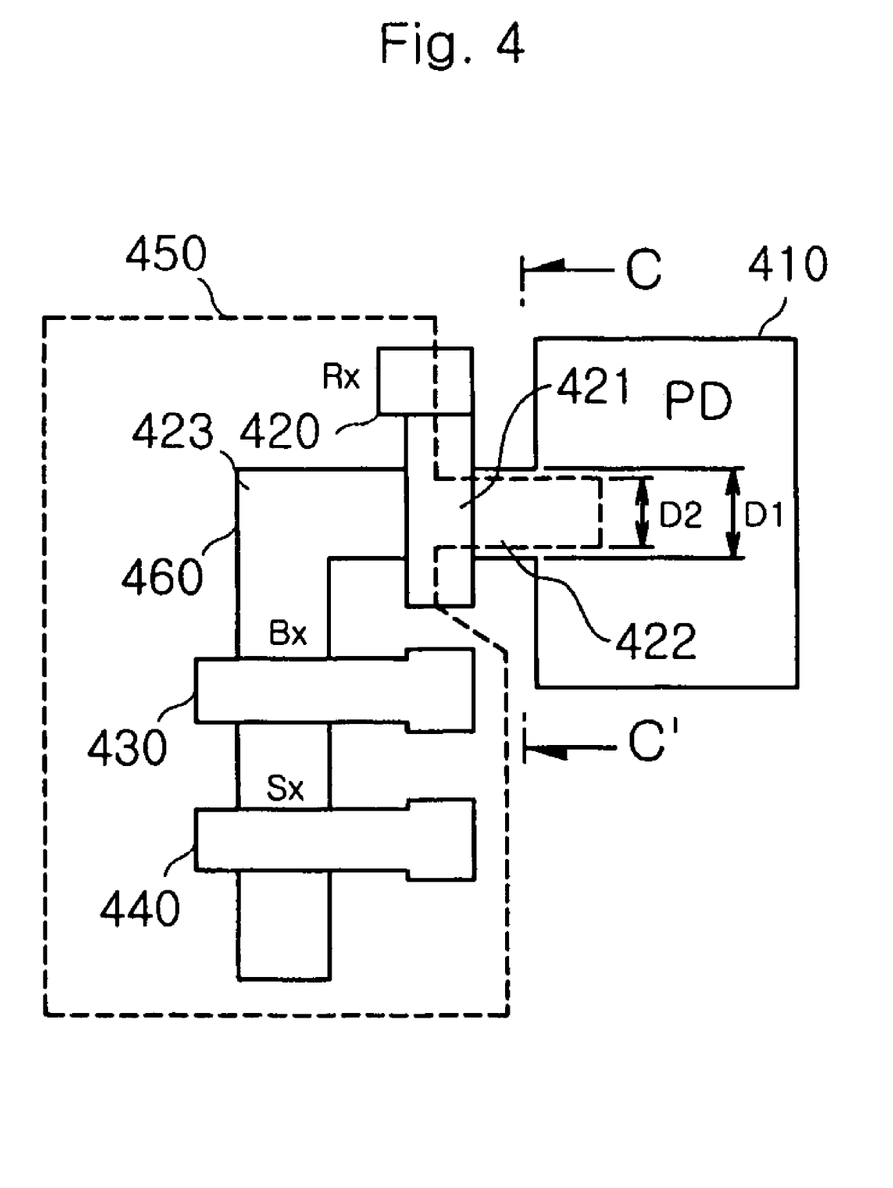
FIG. 4 is a layout diagram for explaining a manufacturing method of a CMOS image sensor according a first embodiment of the present invention.

FIG. 4 is a layout diagram for explaining a manufacturing method of a CMOS image sensor according to a first embodiment of the present invention.

As shown in FIG. 4, and according to the first embodiment of the present invention, during the ion implantation of low-concentration dopant ions for the LDD structures and the ion implantation of high-concentration dopant ions for forming the source/drain regions, the dopant ions are implanted into a region 450 indicated by a dotted line. Also shown in FIG. 4 is a solid line indicating an active region 460.

Referring to FIG. 4, it can be seen that a source region 422 and a drain region 423, which are located on the right and left sides of a gate electrode 421 of a reset transistor 420, are asymmetrical to each other. Particularly, a width D2 of the source region 422 between a photodiode 410 and the gate electrode 421 of the reset transistor 420 is narrower than a width D1 of the active region 460, so that the source region is narrower than the drain region of the reset transistor 420.

Consistent with the first embodiment of the present invention, when the source region 422 is formed by ion implantation, an ion implantation mask substantially covers the field region or element isolating layer between the photodiode 410 and the gate electrode 421. This feature is described in more detail with reference to the drawings.

Figure 5:
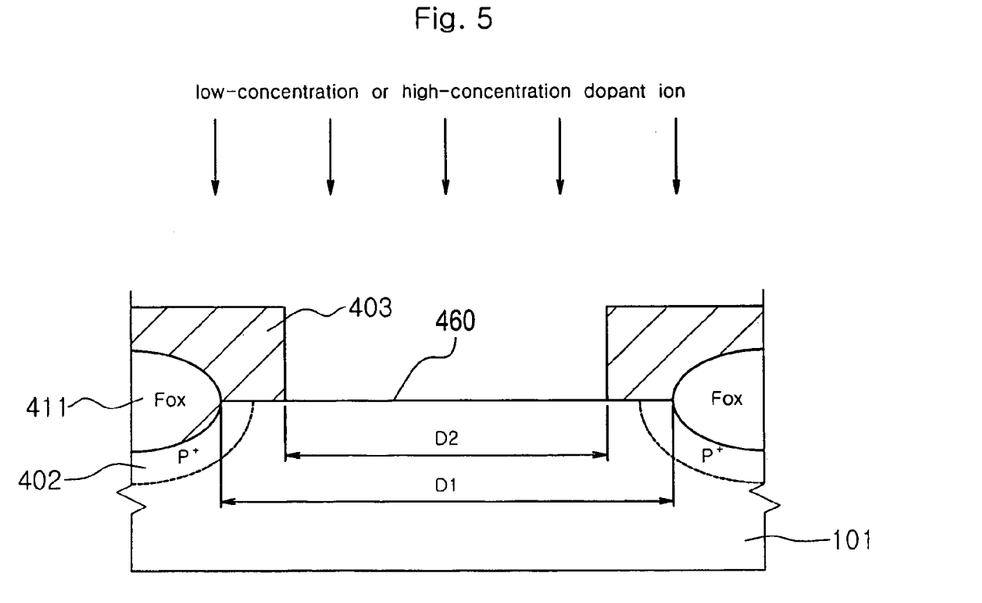
FIG. 5 is a cross-sectional view taken along line C-C' of FIG. 4 for illustration of the manufacturing method of the CMOS image sensor according to the first embodiment of the present invention.

FIG. 5 is a cross-sectional view taken along line C–C' of FIG. 4 for illustration of a manufacturing method according to the first embodiment of the present invention. As shown in FIG. 5, an element isolating layer 411 is formed, defining the active region 460. A photoresist pattern 403 to be used as an ion implantation mask is formed and substantially covers the element isolating layer 411. A part of the active region 460 is also covered by the photoresist pattern 403. Here, the active region 460 as shown in FIG. 5 corresponds to the source region 422 between the photodiode and the gate electrode 421 of the reset transistor 420 in FIG. 4. After the element isolating layer 411 is formed, channel stop ions p+ are implanted beneath the element isolating layer 411 and in a part of the active region 460 adjoining the element isolating layer 411, so as to isolate elements from each other. The implanted channel stop ions p+ have a conductivity type opposite to subsequent dopant ions. In one aspect, when boron ions as p-type dopant ions are implanted as the channel stop ions, the boron ions may be implanted at an energy between 80 and 150 KeV and a concentration between $0.5{\sim}5{\times}10^{13}$ ion/cm$^2$.

Using the photoresist pattern 403 as a mask, low-concentration dopant ions for the LDD structures or high-concentration dopant ions for the source/drain regions are implanted. The ion implantation processes are part of the whole manufacturing process of the photodiode 410 and the reset transistor 420 shown in FIG. 4, wherein the process for implanting the low-concentration dopant ions for the LDD structures is carried out after the gate electrode 421 of the reset transistor 420 is formed, while the process for implanting the high-concentration dopant ions for the source/drain regions is carried out after a spacer (not shown) of the gate electrode 421 is formed. Here, the photodiode 410 may be completed before or after the gate electrode 421 is formed.

As shown in FIG. 5, because the low- and high-concentration dopant ions are not implanted into an interface between the element isolating layer 411 and the active region 460, the problems in the prior art related to implantation of the dopant ions at the interface, such as a damage of the substrate caused by ion implantation, generation of electrons and holes derived from such a damage, recombination of electrons and holes, and so on, are prevented.

Figure 6A:
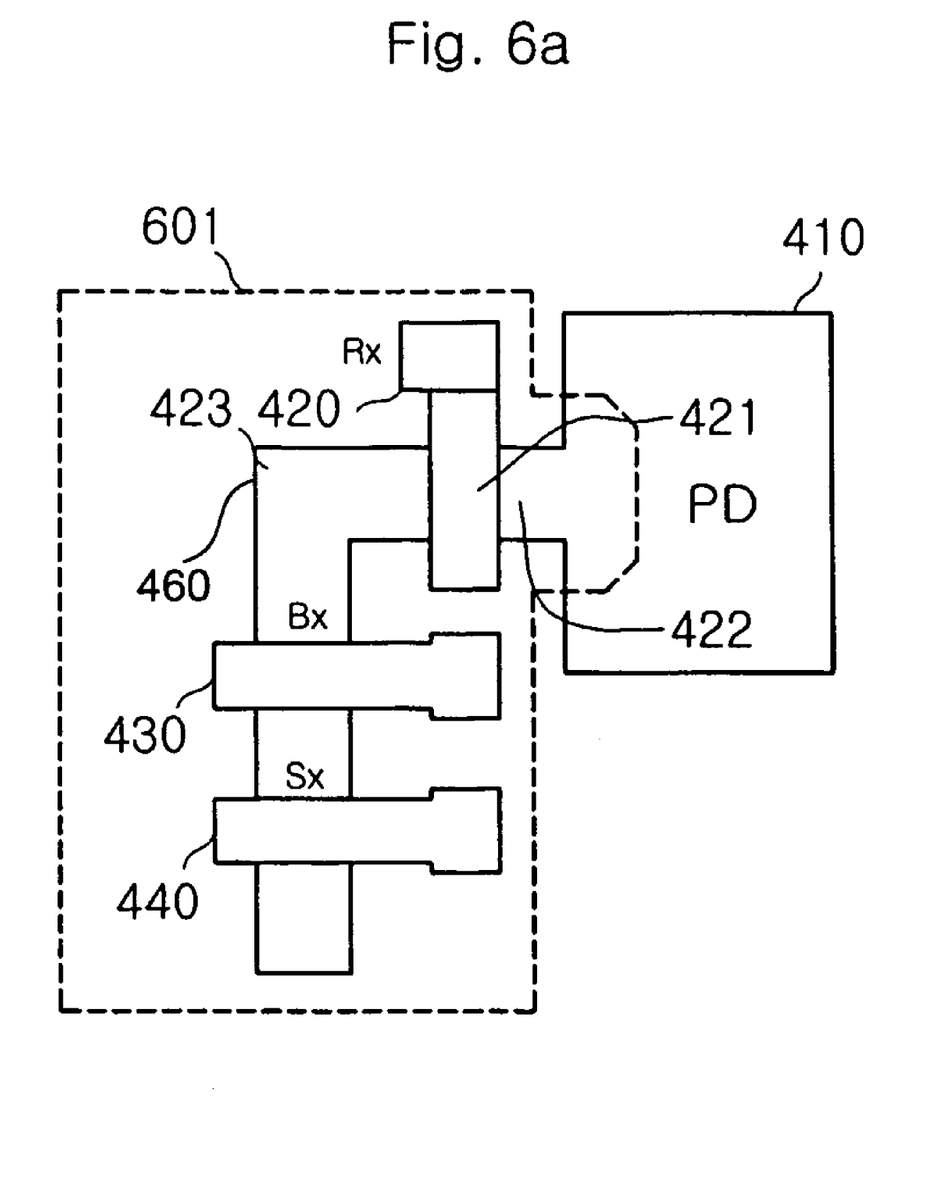
FIGS. 6a and 6b are layout diagrams for explaining a manufacturing method of a CMOS image sensor according a second embodiment of the present invention.
Figure 6B:
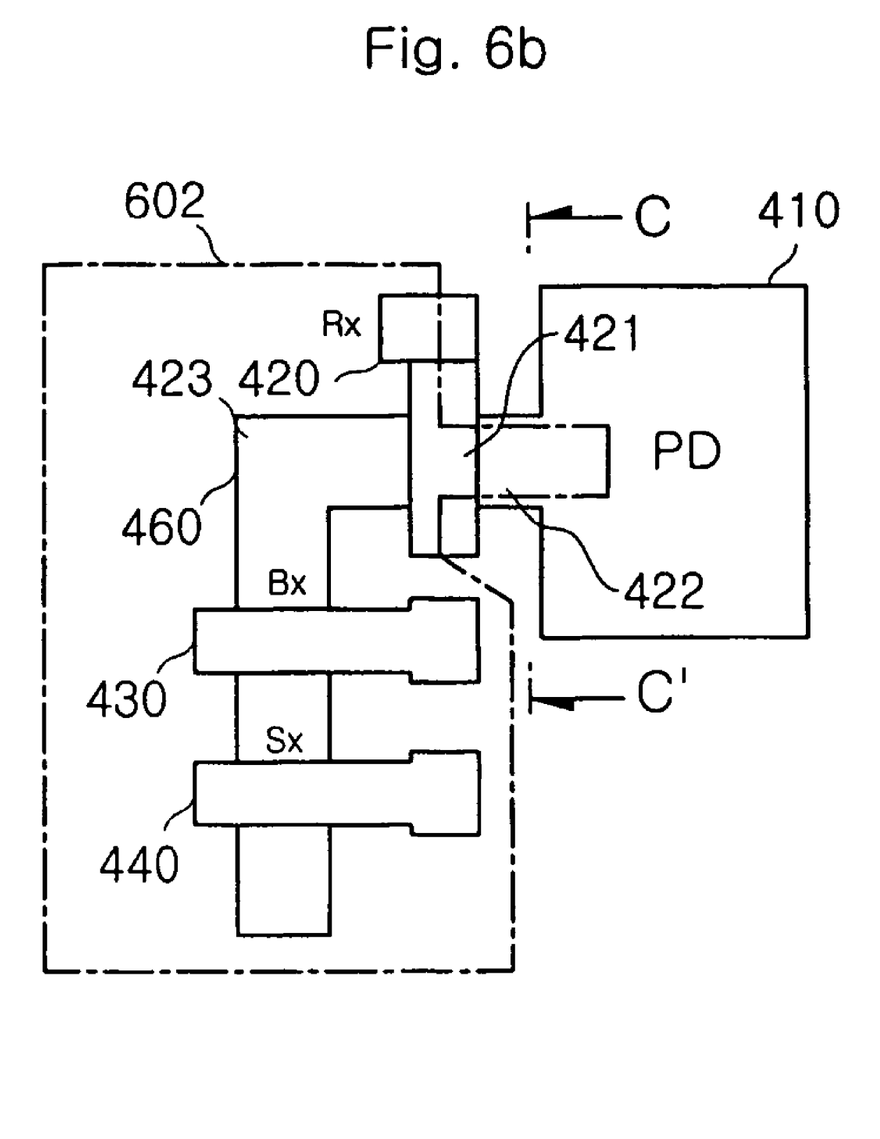

FIGS. 6a and 6b are layout diagrams for explaining a manufacturing method of a CMOS image sensor according to a second embodiment of the present invention. As in the first embodiment of the present invention, in FIGS. 6a and 6b, a dotted line defines a dopant ion implantation region 601 or 602, respectively, while a solid line defines an active region 460. Specifically, the dotted line in FIG. 6a indicates a low-concentration dopant ion implantation region 601 for LDD structures, while the dotted line in FIG. 6b indicates a high-concentration dopant ion implantation region 602 for source/drain regions. In other words, in the second embodiment of the present invention, when dopant ions are implanted, different ion implantation masks are used, depending on the concentration of the corresponding dopant ions.

The second embodiment of the present invention also prevents the interface between the active region and the field region from being damaged by ion implantation. To this end, when dopant ions for the LDD structures are implanted at a relatively low concentration, similar to the prior art, low-concentration dopant ions are implanted into the entire active region 460, as well as a part of the field region 411 next to the source region 422 between the photodiode 410 and the gate electrode 421. However, when high-concentration dopant ions for the source/drain regions are implanted, a different ion implantation mask is used, which substantially covers the field region 411. In other words, when low- and high-concentration dopant ions are implanted, the ion implantation mask for the corresponding dopant ions has a different shape. Therefore, the substrate may be prevented from being damaged by ion implantation.

Figure 7A:
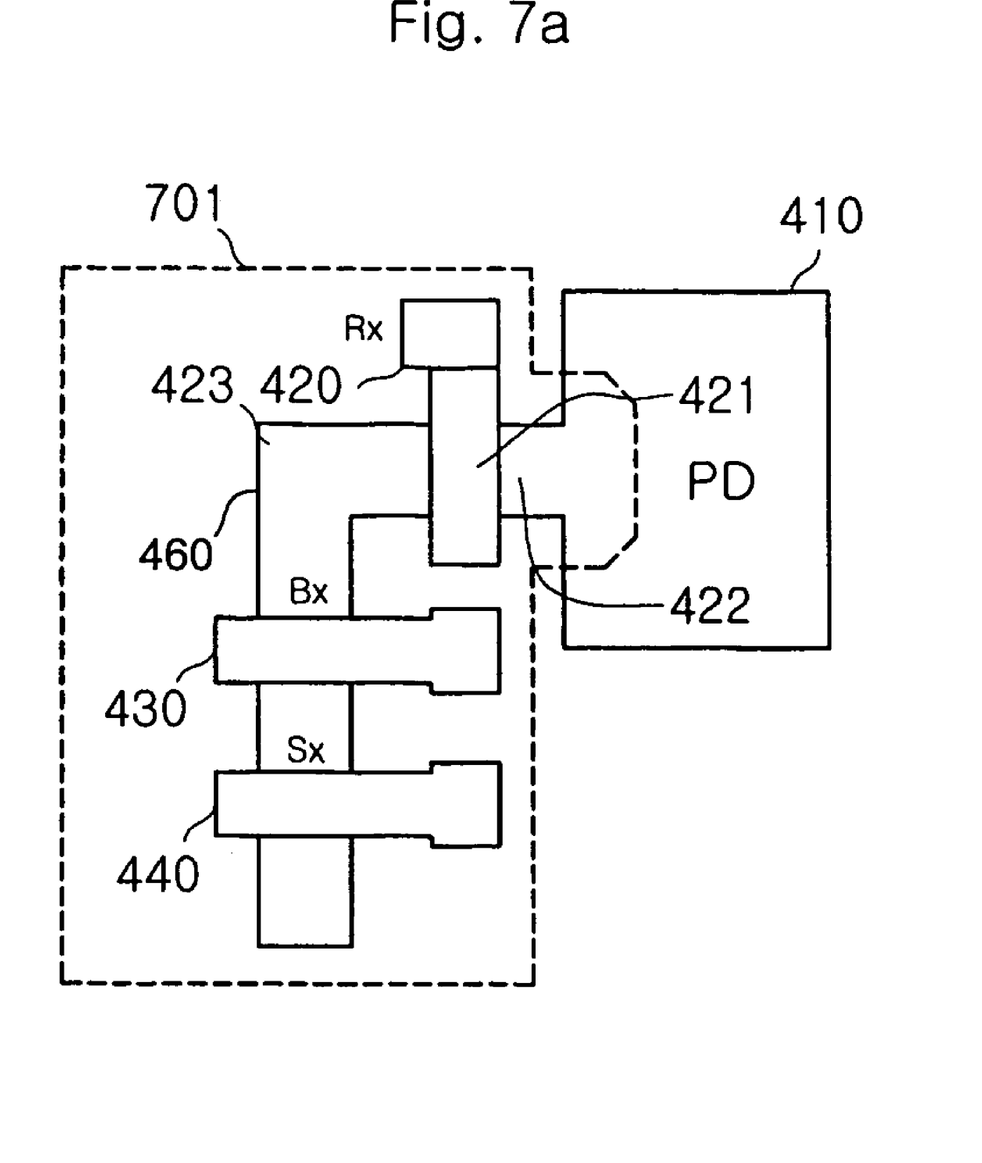
FIGS. 7a and 7b are layout diagrams for explaining a manufacturing method of a CMOS image sensor according a third embodiment of the present invention.
Figure 7B:
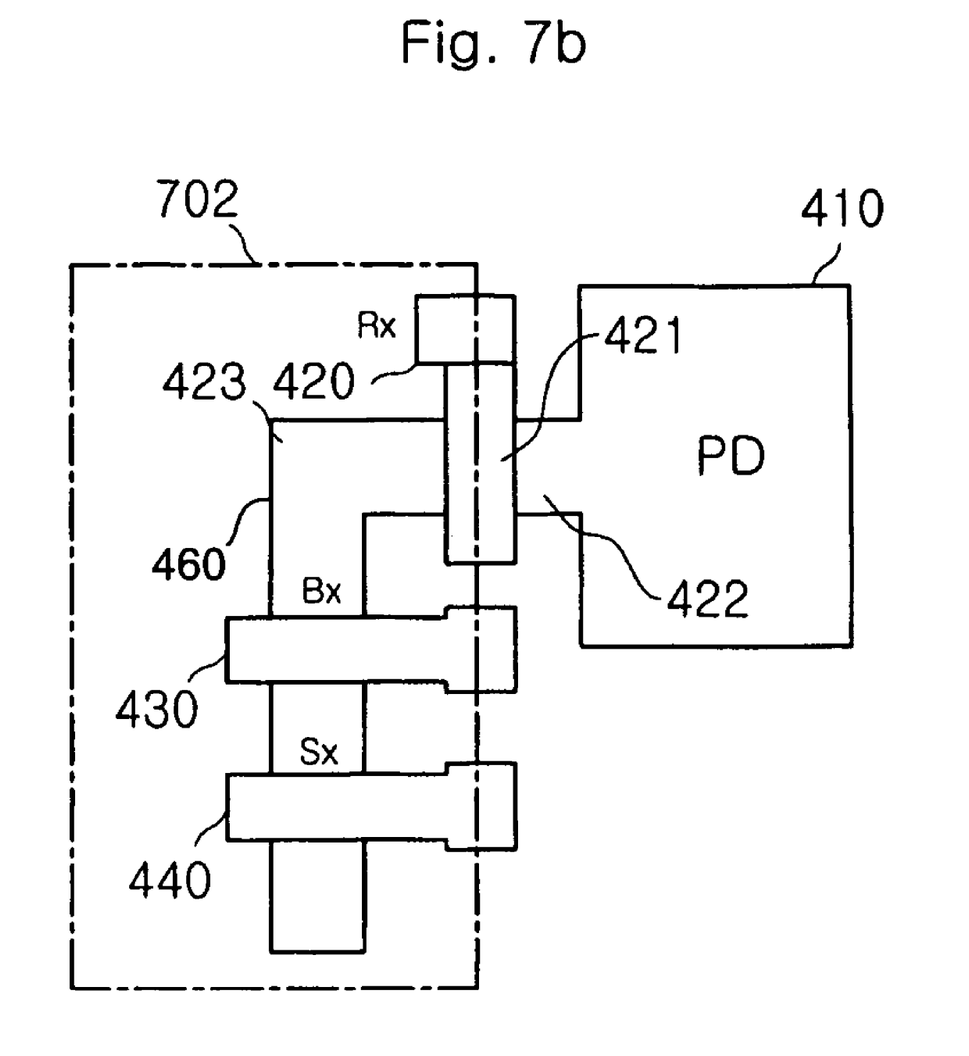

FIGS. 7a and 7b are layout diagrams for explaining a manufacturing method of a CMOS image sensor according to a third embodiment of the present invention. As in the first and second embodiments, in FIGS. 7a and 7b, a dotted line defines a dopant ion implantation region 701 or 702, respectively, while a solid line defines an active region 460. Further, the dotted line in FIG. 7a indicates a low-concentration dopant ion implantation region 701 for LDD structures, while the dotted line in FIG. 7b indicates a high-concentration dopant ion implantation region 702 for source/drain regions.

As in the second embodiment, the third embodiment of the present invention is characterized in that, when dopant ions are implanted, different ion implantation masks are used, depending on the concentration of the corresponding dopant ions. The dopant ion implantation region 701 shown in FIG. 7a, that is, the region exposed by an ion implantation mask is the same as that of FIG. 6a. However, the dopant ion implantation region 702 shown in FIG. 7b, or the region to be implanted by high-concentration dopant ions, unlike that of FIG. 6b, is characterized in that the ion implantation mask is formed to prevent dopant ions from being implanted into the source region between the gate electrode 421 of the reset transistor 420 and the photodiode 410. By preventing high-concentration dopant ions from being implanted into the source region between the gate electrode and the photodiode in the first place, the substrate is prevented from being damaged at the interface between the active region and the field region within the source region by high-concentration dopant ion implantation.

Figure 8:
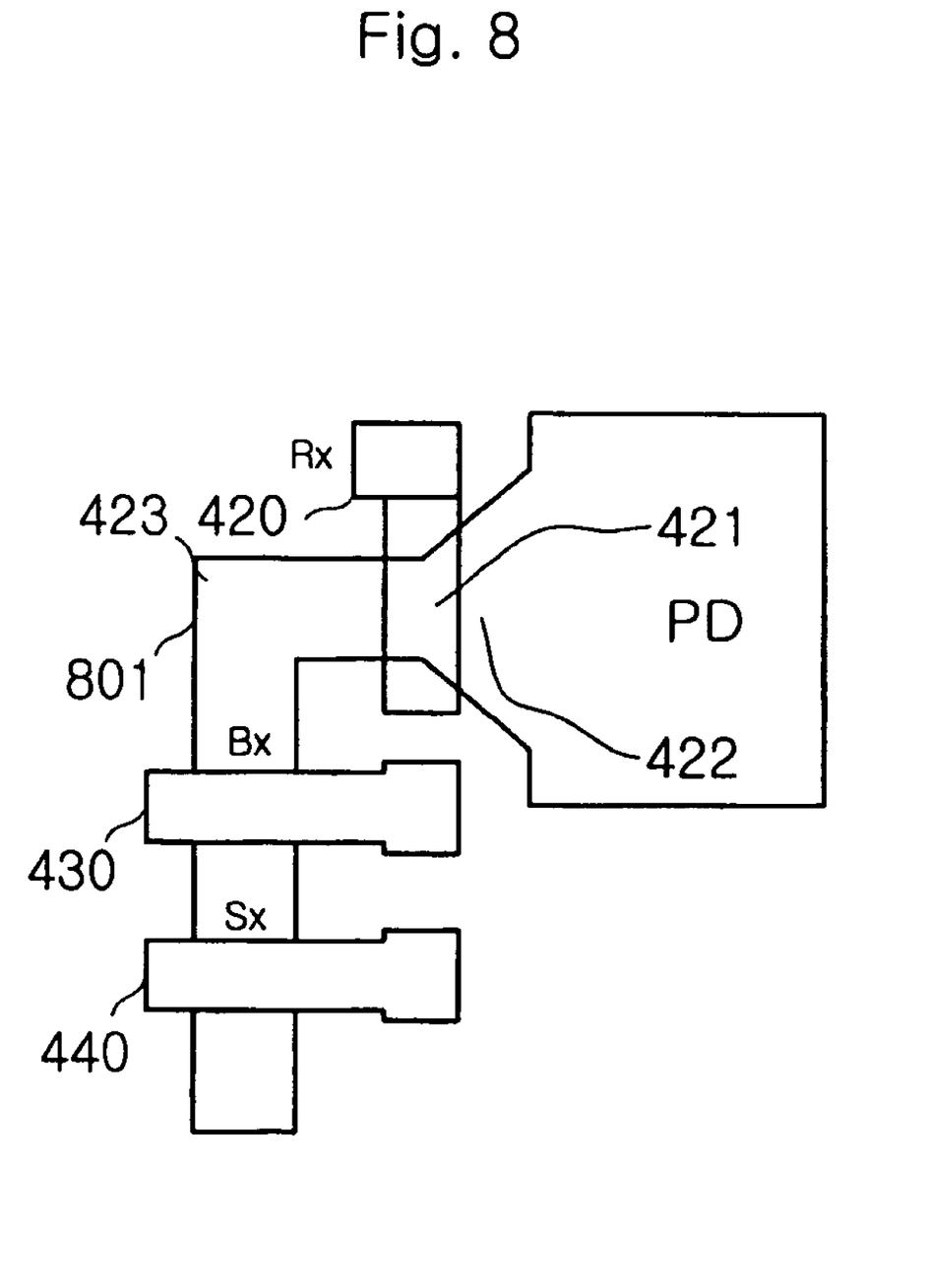
FIG. 8 is a layout diagrams for explaining a manufacturing method of a CMOS image sensor according a fourth embodiment of the present invention.

FIG. 8 is a layout diagram for explaining a manufacturing method of a CMOS image sensor according to a fourth embodiment of the present invention. In FIG. 8, a solid line defines an active region 801. The active region 801 of FIG. 8 has a different shape from that of the prior art and the first, second, and third embodiments of the present invention. According to the fourth embodiment of the present invention, in the source region 422 between the gate electrode 421 of the reset transistor 420 and the photodiode 410, a width of the active region 801 is gradually widened as it goes from the gate electrode 421 to the photodiode 410. This shape can be realized by selectively patterning the element isolating layer (not shown) which defines the active region 801.

Thus, when low-concentration dopant ions for the LDD structures and high-concentration dopant ions for the source/drain regions are implanted, even though the ion implantation mask for the corresponding dopant ions has the same shape as that of the prior art, the ion implantation mask substantially covers the field region. As a result, it is possible to prevent dopant ions from being implanted into the interface between the active region and the field region within the source region in the first place.

Thus, with the active region according to the fourth embodiment of the present invention, a process of implanting dopant ions into a part of the photodiode can be preformed so that that part of the photodiode functions as a source of the reset transistor, without damaging the substrate at the interface between the field region and the active region.

Further, with a combination of the active region according to the fourth embodiment of the present invention and a mode of implanting dopant ions described in any of the first to the third embodiments of the present invention, the effect of preventing the substrate from damages due to ion implantations may be optimized.

Meanwhile, the embodiments of the present invention are described regarding the CMOS image sensor having three transistors. However, in terms of a technical spirit of preventing the substrate from being damaged at the interface between the active region and the field region by ion implantation, one skilled in the art would appreciate that the embodiments of the present invention may also be applied to CMOS image sensors having three or more transistors.

The method for manufacturing CMOS image sensor according to the present invention includes the following effects.

When dopant ions for the LDD structures and the source/drain regions are implanted, it is possible to prevent the substrate from being damaged at the interface between the active region and the field region by ion implantation. Thus, the dark current of the CMOS image sensor can be minimized.

The above-described embodiments of the present invention are only for illustrative purposes. Those skilled in the art will appreciate that various modifications, additions and substitutions are possible, without departing from the scope and spirit of the invention as disclosed in the accompanying claims.

What is claimed is:

1. A method for manufacturing a complementary metal oxide semiconductor (CMOS) image sensor, comprising steps of:
    forming a field region defining an active region on a silicon substrate;
    forming a gate electrode on the substrate;
    forming a photodiode in a portion of the active region;
    forming a masking layer so as to define a region for implanting dopant ions; and
    performing an ion implantation of impurities into the region for implanting dopant ions for forming a lightly doped drain (LDD) structure, a source region, or a drain region, wherein, in the step of forming the masking layer, the masking layer is formed over the field region and a portion of the active region adjoining the field region between the gate electrode and the photodiode so as to define the region for implanting dopant ions.

2. The method as claimed in claim 1, wherein said dopant ions are one of low-concentration dopant ions for an LDD structure and high-concentration dopant ions for a source region or a drain region.

3. The method as claimed in claim 1, wherein said dopant ions are implanted into a part of the photodiode.

4. The method as claimed in claim 2, wherein the source region is formed between the gate electrode and the photodiode.

5. The method as claimed in claim 4, wherein said low-concentration dopant ions for the LDD structure are implanted into a location including a predetermined portion of said field region and the source region, and said high-concentration dopant ions for said source or drain region are implanted so as not to be implanted beyond the source region.

6. The method as claimed in claim 4, wherein said low-concentration dopant ions for the LDD structure are implanted into a location including a predetermined portion of said field region and the source region, and said high-concentration dopant ions for said source or drain region are implanted only into a region on a side of the gate electrode opposite to the source region.

7. The method as claimed in claim 1, further comprising a step of forming a channel stop region having a predetermined thickness beneath said field region and in a predetermined part of said active region adjoining the field region.

8. The method as claimed in claim 1, further comprising a step of forming a channel stop region having a predetermined thickness beneath said field region and in a predetermined part of said active region adjoining the field region.

9. The method as claimed in claim 8, wherein said channel stop region is formed by implanting boron ions as p-type dopant ions at an energy between 80 and 150 KeV and a concentration between $0.5 \sim 5 \times 10^{13}$ ion/cm$^2$.

10. A method for manufacturing a complementary metal oxide semiconductor (CMOS) image sensor, in which the CMOS image sensor includes a photodiode and a reset transistor, the method comprising a step of
defining an active region by means of a field region in such a manner that a source region between a gate electrode of the reset transistor and the photodiode has a width widened from the gate electrode toward the photodiode.

11. The method as claimed in claim 10, further comprising a step of forming a channel stop region having a predetermined thickness beneath the field region and in a predetermined location of the active region adjoining the field region.

12. The method as claimed in claim 11, wherein said channel stop region is formed by implanting boron ions as p-type dopant ions at an energy between 80 and 150 KeV and a concentration between $0.5 \sim 5 \times 10^{13}$ ion/cm$^2$.

13. A method for manufacturing a complementary metal oxide semiconductor (CMOS) image sensor, comprising steps of:
forming a field region defining an active region on a silicon substrate;
forming a gate electrode on the substrate;
forming a photodiode in a portion of the active region;
forming a masking layer over the field region, and performing a low-concentration dopant ion implantation for an LDD structure;
forming a masking layer over the field region and a portion of the active region adjoining the field region between the gate electrode and the photodiode so as to define the region for implanting a high-concentration dopant ions; and
performing a high-concentration dopant ion implantation into the region for implanting a high concentration dopant ions for forming a source region or a drain region.

14. A method for manufacturing a complementary metal oxide semiconductor (CMOS) image sensor, comprising steps of:
forming a field region defining an active region on a silicon substrate;
forming a gate electrode on the substrate;
forming a photodiode in a portion of the active region;
forming a masking layer over the field region, and performing a low-concentration dopant ion implantation for an LDD structure;
forming a masking layer over the field region, the photodiode, and a region between the gate electrode and the photodiode so as to define a region for implanting a high-concentration dopant ions; and
performing a high-concentration dopant ion implantation into the region for implanting a high concentration dopant ions for forming a source region or a drain region.

* * * * *